United States Patent
Kuroda et al.

(10) Patent No.: US 12,063,483 B2
(45) Date of Patent: Aug. 13, 2024

(54) SIGNAL PROCESSING DEVICE, SIGNAL PROCESSING METHOD, PROGRAM, AND VIDEO DISPLAY DEVICE

(71) Applicant: Sony Group Corporation, Tokyo (JP)

(72) Inventors: Yoshiyuki Kuroda, Chiba (JP); Michiaki Yoneda, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 292 days.

(21) Appl. No.: 17/607,569

(22) PCT Filed: Mar. 30, 2020

(86) PCT No.: PCT/JP2020/014593
§ 371 (c)(1),
(2) Date: Oct. 29, 2021

(87) PCT Pub. No.: WO2020/226000
PCT Pub. Date: Nov. 12, 2020

(65) Prior Publication Data
US 2022/0225042 A1 Jul. 14, 2022

(30) Foreign Application Priority Data
May 8, 2019 (JP) ................................. 2019-087988

(51) Int. Cl.
*H04R 29/00* (2006.01)
*H03G 3/20* (2006.01)
*H04R 1/02* (2006.01)

(52) U.S. Cl.
CPC ............. *H04R 29/001* (2013.01); *H03G 3/20* (2013.01); *H04R 1/02* (2013.01); *H04R 2440/05* (2013.01); *H04R 2499/15* (2013.01)

(58) Field of Classification Search
CPC .... H04R 29/001; H04R 1/02; H04R 2440/05; H04R 2499/15; H04R 2430/01; H03G 3/20; H03G 3/301; H03G 5/10
See application file for complete search history.

(56) References Cited

U.S. PATENT DOCUMENTS

| 9,225,903 | B2 * | 12/2015 | Nakayama | G03B 5/00 |
| 2015/0138157 | A1 * | 5/2015 | Harris | H04R 3/02 |
| | | | | 345/175 |

(Continued)

FOREIGN PATENT DOCUMENTS

| JP | H08-336088 A | 12/1996 |
| JP | 2005-012618 A | 1/2005 |

(Continued)

OTHER PUBLICATIONS

International Search Report and English translation thereof mailed Jun. 30, 2020 in connection with International Application No. PCT/JP2020/014593.

*Primary Examiner* — Oyesola C Ojo
(74) *Attorney, Agent, or Firm* — Wolf, Greenfield & Sacks, P.C.

(57) ABSTRACT

Provided is a signal processing device including a displacement detection unit configured to detect a displacement amount of a video display panel that is vibrated to generate sound on the basis of an input audio signal, a threshold setting unit configured to calculate a displacement amount at which no image shake occurs and set a displacement amount calculated as a threshold, and a gain adjustment unit configured to adjust a level of the input audio signal on the basis of a result of comparison between a displacement amount detected by the displacement detection unit and the threshold.

13 Claims, 10 Drawing Sheets

(56) References Cited

U.S. PATENT DOCUMENTS

| | | | |
|---|---|---|---|
| 2015/0195458 A1* | 7/2015 | Nakayama | H04N 23/6812 |
| | | | 348/208.11 |
| 2015/0370328 A1* | 12/2015 | Backman | G06F 3/041 |
| | | | 345/156 |
| 2017/0244900 A1* | 8/2017 | Ito | H04N 23/683 |
| 2018/0270423 A1* | 9/2018 | Takahashi | H04N 23/63 |

FOREIGN PATENT DOCUMENTS

| | | |
|---|---|---|
| JP | 2014-039232 A | 2/2014 |
| JP | 2014187528 A | 10/2014 |
| WO | WO 2013/171512 A2 | 11/2013 |
| WO | WO 2018/123310 A1 | 7/2018 |

* cited by examiner

FIG. 1
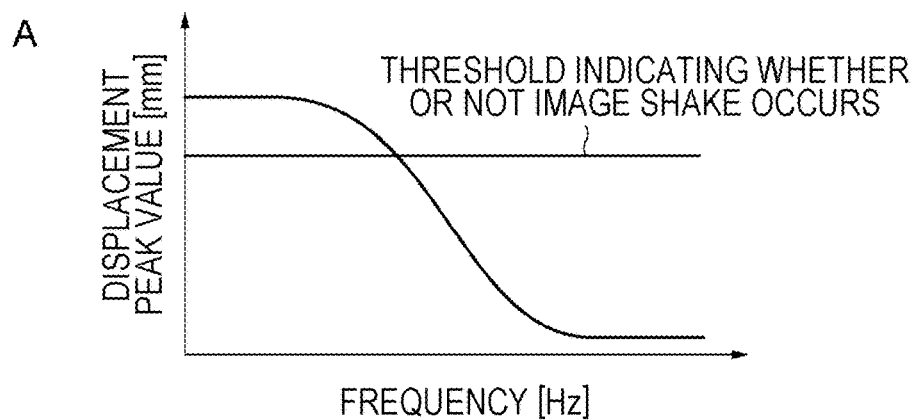
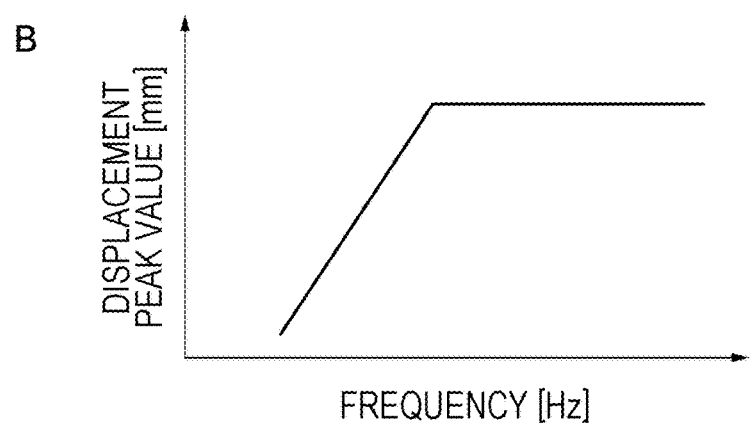
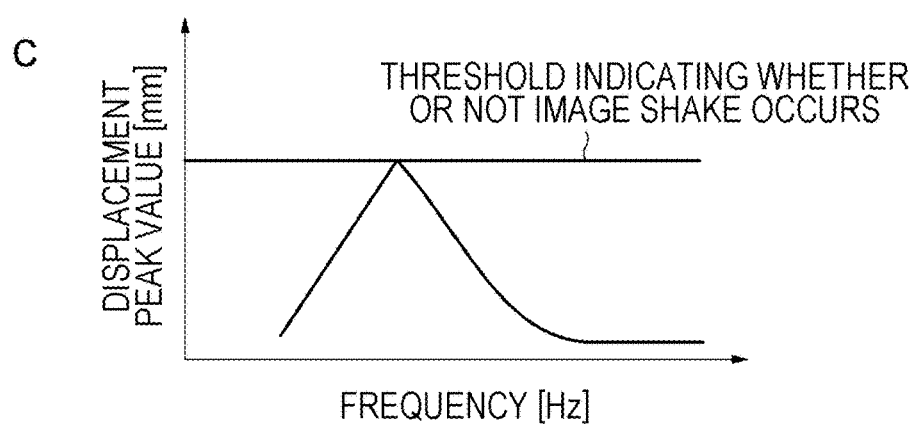

SIGNAL PROCESSING DEVICE, SIGNAL PROCESSING METHOD, PROGRAM, AND VIDEO DISPLAY DEVICE

CROSS-REFERENCE TO RELATED APPLICATIONS

This application claims the benefit under 35 U.S.C. § 371 as a U.S. National Stage Entry of International Application No. PCT/JP 2020/014593, filed in the Japanese Patent Office as a Receiving Office on Mar. 30, 2020, which claims priority to Japanese Patent Application Number JP2019-087988, filed in the Japanese Patent Office on May 8, 2019, each of which is hereby incorporated by reference in its entirety.

TECHNICAL FIELD

The present disclosure relates to a signal processing device, a signal processing method, a program, and a video display device.

BACKGROUND ART

Patent Document 1 describes a video display device that is configured to generate sound by vibrating a video display panel.

CITATION LIST

Patent Document

Patent Document 1: WO 2018/123310 A

SUMMARY OF THE INVENTION

Problems to be Solved by the Invention

In a case where the video displayed on the video display panel is dark or the like, an object (for example, an object present at a position facing the video display panel) or a viewer/listener in a viewing/listening space is reflected on the video display panel. There is a problem that when the video display panel vibrates, an image shake in which the object or the like reflected on the video display panel shakes is visually recognized, and the viewer/listener who views/listens to a video feels uncomfortable.

An object of the present disclosure is to provide a signal processing device, a signal processing method, a program, and a video display device capable of effectively suppressing the occurrence of image shake.

Solutions to Problems

The present disclosure provides, for example, a signal processing device including:
a displacement detection unit configured to detect a displacement amount of a video display panel that is vibrated to generate sound on the basis of an input audio signal;
a threshold setting unit configured to calculate a displacement amount at which no image shake occurs and set a displacement amount calculated as a threshold; and
a gain adjustment unit configured to adjust a level of the input audio signal on the basis of a result of comparison between a displacement amount detected by the displacement detection unit and the threshold.

The present disclosure provides, for example, a signal processing method including:
causing a displacement detection unit to detect a displacement amount of a video display panel that is vibrated to generate sound on the basis of an input audio signal;
causing a threshold setting unit to calculate a displacement amount at which no image shake occurs and set a displacement amount calculated as a threshold; and
causing a gain adjustment unit to adjust a level of the input audio signal on the basis of a result of comparison between a displacement amount detected by the displacement detection unit and the threshold.

The present disclosure provides, for example, a program that causes a computer to perform a signal processing method, the signal processing method including
causing a displacement detection unit to detect a displacement amount of a video display panel that is vibrated to generate sound on the basis of an input audio signal,
causing a threshold setting unit to calculate a displacement amount at which no image shake occurs and set a displacement amount calculated as a threshold, and
causing a gain adjustment unit to adjust a level of the input audio signal on the basis of a result of comparison between a displacement amount detected by the displacement detection unit and the threshold.

The present disclosure provides, for example, a video display device including:
a vibration portion;
a video display panel configured to display a video and generate sound by being vibrated by the vibration portion;
a panel displacement control unit configured to control displacement of the video display panel; and
an amplifier configured to amplify an audio signal output from the panel displacement control unit and output an audio signal amplified to the vibration portion, in which the panel displacement control unit includes
a displacement detection unit configured to detect a displacement amount of the video display panel on the basis of an input audio signal,
a threshold setting unit configured to calculate a displacement amount at which no image shake occurs and set a displacement amount calculated as a threshold, and
a gain adjustment unit configured to adjust a level of the input audio signal on the basis of a result of comparison between a displacement amount detected by the displacement detection unit and the threshold.

BRIEF DESCRIPTION OF DRAWINGS

FIGS. 1A to 1C are diagrams referred to in describing the outline of an embodiment.

MODE FOR CARRYING OUT THE INVENTION

Figure 2:
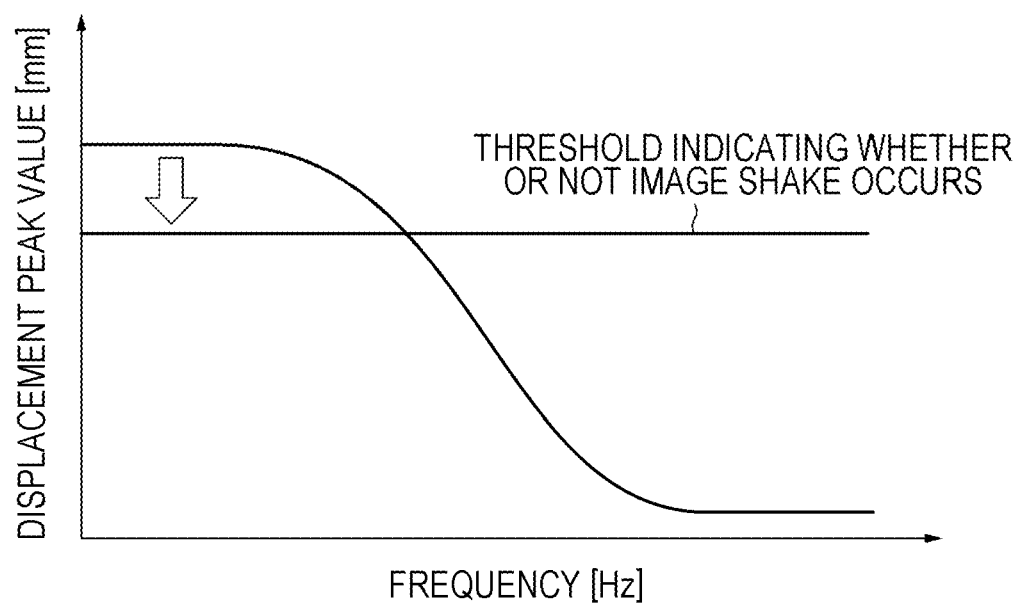
FIG. 2 is a diagram referred to in describing the outline of the embodiment.

An embodiment and the like of the present disclosure will be described in the following order.
<Outline of Embodiment>
<Embodiment>
<Modification>

The embodiment and the like to be described below are preferred specific examples of the present disclosure, and the contents of the present disclosure are not limited to the embodiment and the like.

Outline of Embodiment

FIGS. 1A to 1C are diagrams referred to in describing the outline of the present embodiment. In the present embodiment, a description will be given using a system in which a video display panel is vibrated by a vibration portion such as an actuator. The displacement characteristics of the video display panel can be measured in advance by irradiating the video display panel with a laser or the like. FIG. 1A is a diagram illustrating an example of the displacement characteristics of the video display panel. FIG. 1A illustrates, as the displacement characteristics, frequency characteristics of displacement (mm) generated in a case where an audio signal with a constant input voltage is input to the vibration portion to vibrate the video display panel. As illustrated in FIG. 1A, the lower the frequency, the larger the displacement amount. In addition, a threshold indicating whether or not image shake occurs is set, and when the displacement amount of the video display panel exceeds the threshold, the image shake becomes conspicuous to such an extent that the image shake is visually recognized.

As a solution for effectively suppressing image shake, a method of using a high-pass filter having characteristics as schematically illustrated in FIG. 1B is conceivable. By cutting a low-frequency component using the high-pass filter, as illustrated in FIG. 1C, the displacement amount of the video display panel can be prevented from exceeding the threshold, and the image shake can be effectively suppressed. However, since the low frequency is always cut by a fixed high-pass filter in this method, there is a possibility that a signal of a low-frequency component that does not exceed the threshold is also cut. In addition, it is conceivable to use a subwoofer for reproducing a low-frequency component of an audio signal in combination, but there is a possibility that reproduction of sound by a panel and the sound pressure around the crossover frequency of the subwoofer are lowered due to an increased cutoff frequency. Consequently, it is desirable to secure the sound pressure of the signal of the low-frequency component while effectively suppressing the image shake.

Meanwhile, the degree of conspicuousness of the image shake varies depending on the characteristics of a video input to the video display panel, the brightness of the space in which the video display panel is present, the specification such as the reflectance of the video display panel, the viewing/listening position, and the like even if the displacement amount of the identical video display panel is used. Consequently, it is preferable to dynamically change the threshold indicating whether or not image shake occurs according to the factors described above.

For this reason, the threshold indicating whether or not image shake occurs is appropriately set in the present embodiment. Furthermore, as illustrated in FIG. 2, in a case where the displacement amount of the video display panel exceeds the threshold, the level of an audio signal is reduced. As described above, the lower the frequency of the audio signal, the larger the displacement amount of the video display panel, so that the level of the low-frequency component of the audio signal is mainly attenuated. As a result, the vibration of the video display panel can be suppressed, and thus the occurrence of image shake can be suppressed.

Embodiment

Configuration Example of Video Display Device

Figure 3:
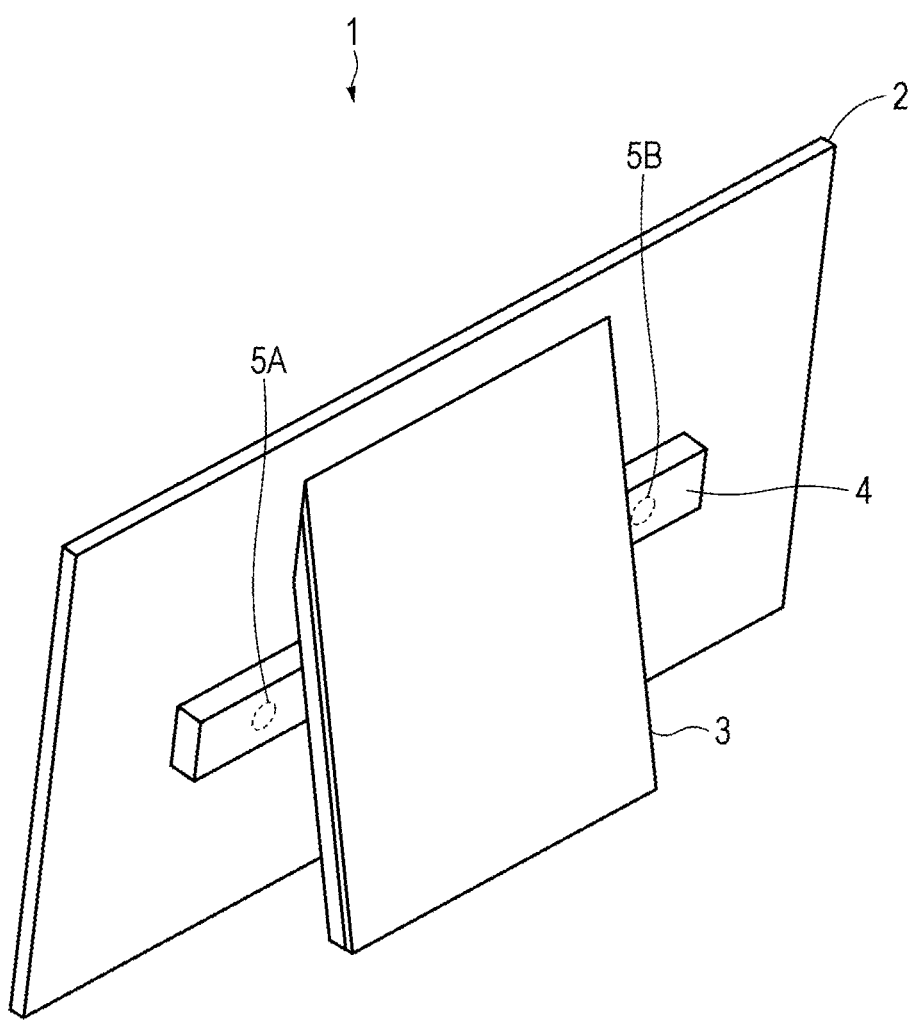
FIG. 3 is a perspective view of a video display device according to the embodiment.
Figure 4:
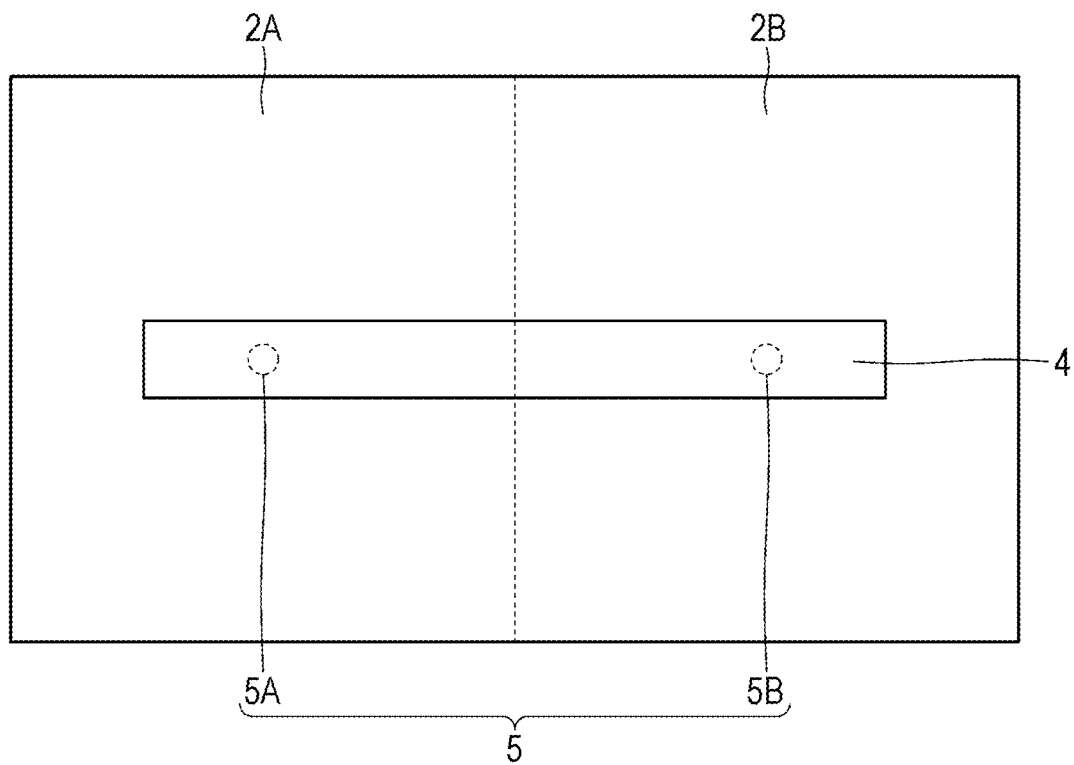
FIG. 4 is a back view of the video display device according to the embodiment.

FIGS. 3 and 4 are diagrams for describing a configuration example of a video display device (a video display device 1) according to the present embodiment. FIG. 3 is a perspective view of the video display device 1 as viewed from a back side (a surface opposite to a surface on which a video is displayed), and FIG. 4 is a plan view of the video display device 1 as viewed from the back side. The video display device 1 includes a panel portion 2, a support portion 3, and a storage portion 4.

The panel portion 2 is a video display panel for displaying a video. As illustrated in FIG. 4, the panel portion 2 according to the present embodiment has a configuration in which two panel portions (panel portions 2A and 2B) are integrated. It is needless to mention that the panel portion 2 may include one panel portion or three or more panel portions. An organic light emitting diode (OLED), a liquid crystal display (LCD), or the like can be applied to the panel portion 2.

The support portion 3 is attached to the back of the panel portion 2 and supports the panel portion 2. Note that the support portion 3 may be attached to the back surface of the panel portion 2 via a rotating portion such as a hinge. The inclination angle of the panel portion 2 may be adjusted by rotating the rotating portion to move the support portion 3. Note that in the present embodiment, the support portion 3 functions as a speaker of a subwoofer.

The storage portion 4 has, for example, a rod-like shape, and is installed on the back surface of the panel portion 2. The storage portion 4 stores a vibration portion 5 that vibrates the panel portion 2, a control circuit (for example, a panel displacement control unit to be described later) that supplies an audio signal to the vibration portion 5, and the like. The vibration portion 5 stored in the storage portion 4 includes, for example, two vibrators (vibrators 5A and 5B). The vibrators 5A and 5B are, for example, piezoelectric actuators. Each of the two vibrators 5A and 5B is installed near the center of the back surface of the corresponding panel portion. Specifically, the vibrator 5A is installed near the center of the back surface of the panel portion 2A, and the vibrator 5B is installed near the center of the back surface of the panel portion 2B (see FIG. 4). Note that a plurality of vibrators that are controlled in the same manner may be installed near the center of the back surface of each panel portion.

Internal Configuration Example of Video Display Device

Figure 5:
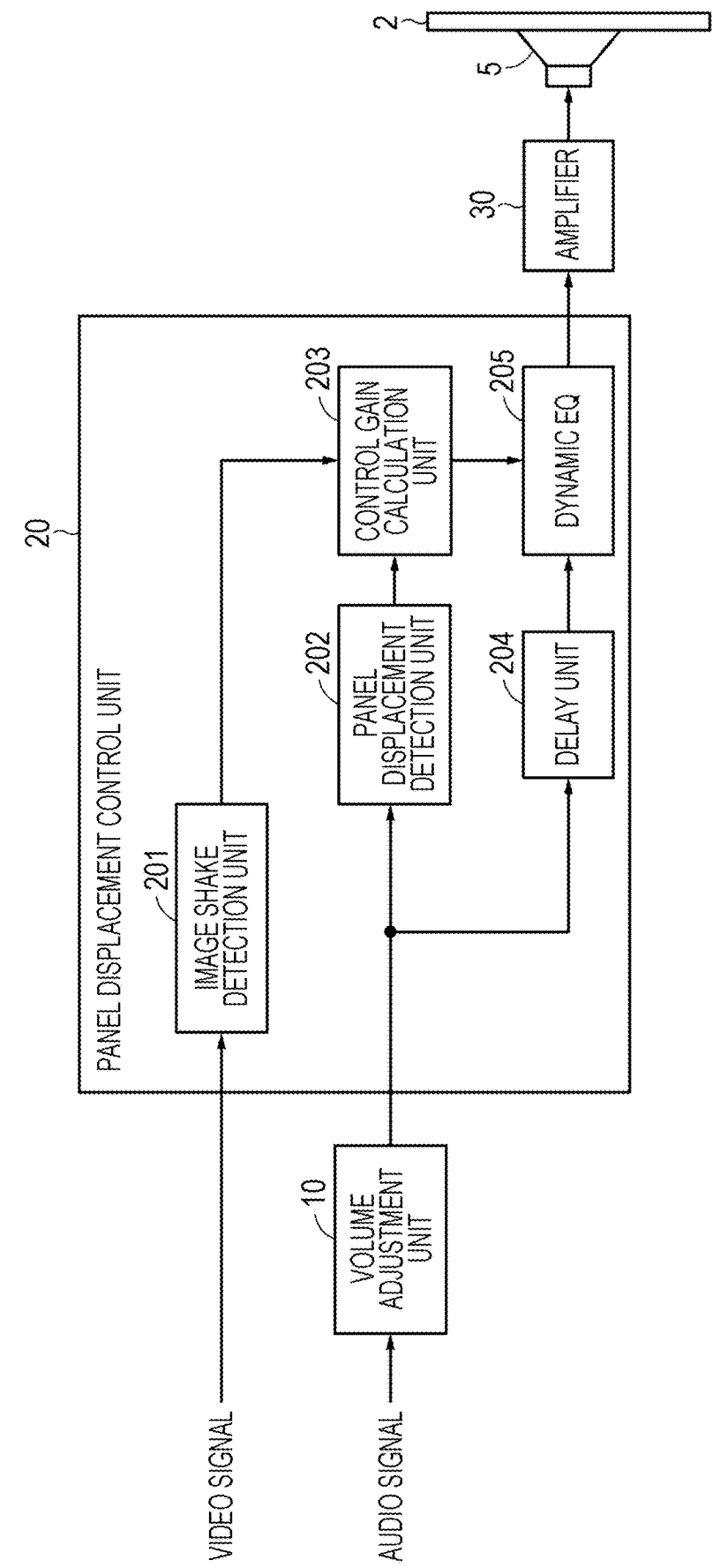
FIG. 5 is a block diagram including an internal configuration of the video display device according to the embodiment.

FIG. 5 is a block diagram illustrating a configuration including an internal configuration of the video display device 1. A video signal and an audio signal are input to the video display device 1 as source signals. The video signal and the audio signal are input to the video display device 1 through a broadcast, a network such as the Internet, from a hard disk, an appropriate memory such as an optical disk or a universal serial bus (USB) memory, or the like. Note that a configuration of processing a video signal is omitted in FIG. 5. The video signal input to the video display device 1 is processed by a known video processing circuit, and then supplied to and displayed on the panel portion 2.

The video display device 1 includes a volume adjustment unit 10, a panel displacement control unit 20, and an amplifier 30. Note that, in a case where the vibration portion 5 includes two vibrators 5A and 5B as in the present embodiment, the volume adjustment unit 10, the panel displacement control unit 20, and the amplifier 30 are provided for each vibrator.

The panel displacement control unit 20 is connected to an output side of the volume adjustment unit 10. The amplifier 30 is connected to an output side of the panel displacement control unit 20. The vibration portion 5 described above is connected to an output side of the amplifier 30.

The volume adjustment unit 10 adjusts the volume so that the level of an input audio signal reaches a level corresponding to a set volume. The audio signal subjected to volume adjustment by the volume adjustment unit 10 is output to the panel displacement control unit 20.

Schematically, the panel displacement control unit 20 adjusts the low-frequency level of the input audio signal supplied from the volume adjustment unit 10 on the basis of a control gain. The input audio signal having the low-frequency level adjusted is output from the panel displacement control unit 20 to the amplifier 30. Note that the low-frequency band means a band with a frequency lower than a predetermined threshold, and is, for example, about 20 Hz to 200 Hz.

The amplifier 30 amplifies the audio signal supplied from the panel displacement control unit 20 with a predetermined amplification factor. The audio signal amplified by the amplifier 30 is supplied to the vibration portion 5. The vibration portion 5 vibrates on the basis of the audio signal supplied from the amplifier 30, and then the panel portion 2 vibrates due to the vibration of the vibration portion 5. The viewer/listener of the video display device 1 listens to the sound generated by the vibration of the panel portion 2.

(Details of Panel Displacement Control Unit)

The panel displacement control unit 20 includes, for example, an image shake detection unit 201 as an example of a threshold setting unit, a panel displacement detection unit 202 as an example of a displacement detection unit, a control gain calculation unit 203, a delay unit 204, and a dynamic equalizer (EQ) 205 as an example of a gain adjustment unit. The video signal is supplied to the image shake detection unit 201 as an input video signal. The audio signal supplied from the volume adjustment unit 10 is supplied to each of the panel displacement detection unit 202 and the delay unit 204 as the input audio signal.

The image shake detection unit 201 calculates a displacement amount at which no image shake occurs, and sets the displacement amount calculated as a threshold. For example, the image shake detection unit 201 calculates the displacement amount on the basis of the characteristics of the input video signal input to the image shake detection unit 201. Specifically, the characteristics of the input video signal are characteristics related to the luminance of the input video signal. More specifically, the characteristics related to the luminance of the input video signal include a luminance average value obtained by averaging the luminance of each pixel in a frame constituting the input video signal. The image shake detection unit 201 supplies the threshold calculated to the control gain calculation unit 203.

In a case where the luminance of the input video signal is small, that is, in a case where the input video signal is a dark image as a whole, there is a high possibility that reflection occurs on the panel portion 2, and image shake in which reflection vibrates occurs. For this reason, in a case where the luminance of the input video signal is small, the image shake detection unit 201 reduces the threshold. Although the details will be described later, by reducing the threshold, the level of the low-frequency component of the audio signal is attenuated, and thus the vibration of the panel portion 2 is suppressed. As a result, the occurrence of image shake can be effectively suppressed.

On the other hand, in a case where the luminance of the input video signal is large, that is, in a case where the input video signal is a bright image as a whole, reflection on the panel portion 2 does not occur or is inconspicuous, so that there is a low possibility that image shake occurs. For this reason, in a case where the luminance of the input video signal is large, the image shake detection unit 201 increases the threshold. By setting the threshold to be increased, the level of the low-frequency component of the input audio signal is maintained without being attenuated, or the attenuation amount is reduced. As a result, the sound pressure can be secured.

The threshold corresponding to the luminance average value is set in advance as follows, for example. In a state where a certain number of subjects are viewing/listening, a video signal with a predetermined luminance average value is input, and the panel portion 2 is vibrated while changing the displacement amount. The displacement amount at which the number of subjects who visually recognize the image shake is more than or equal to a predetermined number is set as the threshold corresponding to the luminance average value. A table, an arithmetic expression, or the like in which the luminance average value and the threshold are associated with each other is stored in an appropriate memory as the characteristics of the panel portion 2. The image shake detection unit 201 calculates the luminance average value of the input video signal, and then calculates the threshold at which no image shake occurs on the basis of the luminance average value calculated and the characteristics of the panel portion 2 measured in advance. Note that the displacement amount at which no image shake occurs may be a displacement amount at which the number of subjects who visually recognize the image shake is zero, or a displacement amount at which the number of subjects who visually recognize the image shake is less than or equal to a certain number.

The panel displacement detection unit 202 detects the displacement amount of the panel portion 2 that is vibrated by the vibration portion 5 to generate sound on the basis of the input audio signal supplied from the volume adjustment unit 10. The panel displacement detection unit 202 includes a filter that approximates displacement characteristics of the panel portion 2 measured in advance (for example, a second-order infinite impulse response (IIR) low pass filter (LPF)). The panel displacement detection unit 202 performs filter processing on the input audio signal to detect the displacement amount of the panel portion 2 with respect to the input audio signal.

The control gain calculation unit 203 compares the threshold supplied from the image shake detection unit 201 with the displacement amount detected by the panel displacement detection unit 202 to calculate a control gain on the basis of the result of comparison. The control gain is a parameter indicating the degree of reducing the level of a low-frequency component of an audio signal. The low-frequency band is a preset band. As described above, since the displacement amount of the panel portion 2 becomes larger as the audio signal is in a lower frequency band, the displacement amount of the panel portion 2 can be reduced by attenuating the level of the low-frequency component of the audio signal with the control gain.

The control gain calculation unit 203 calculates the control gain corresponding to the amount by which the displacement amount detected by the panel displacement detection unit 202 exceeds the threshold. Specifically, the control gain calculation unit 203 calculates a control gain (−3 dB, −6 dB, or the like) with which the attenuation amount of the low-frequency component of the input audio signal increases as the amount by which the displacement amount detected by the panel displacement detection unit 202 exceeds the threshold increases. In a case where the displacement amount detected by the panel displacement detection unit 202 does not exceed the threshold, the control gain calculation unit 203 outputs 0 dB (decibel) as the control gain. When the control gain is 0 dB, that is, one time, this means that the audio signal is output as it is without reducing the level of the low-frequency component.

The delay unit 204 delays the input audio signal during the period in which the control gain calculation unit 203 performs processing of calculating the control gain. The input audio signal delayed by the delay unit 204 is supplied to the dynamic EQ 205.

Figure 6:
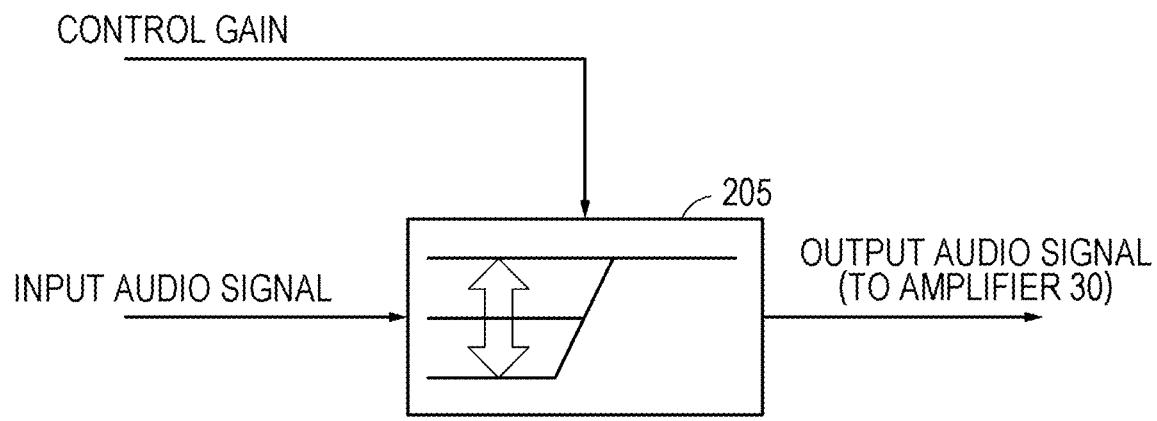
FIG. 6 is a diagram referred to in describing a dynamic EQ according to the embodiment.
Figure 7:
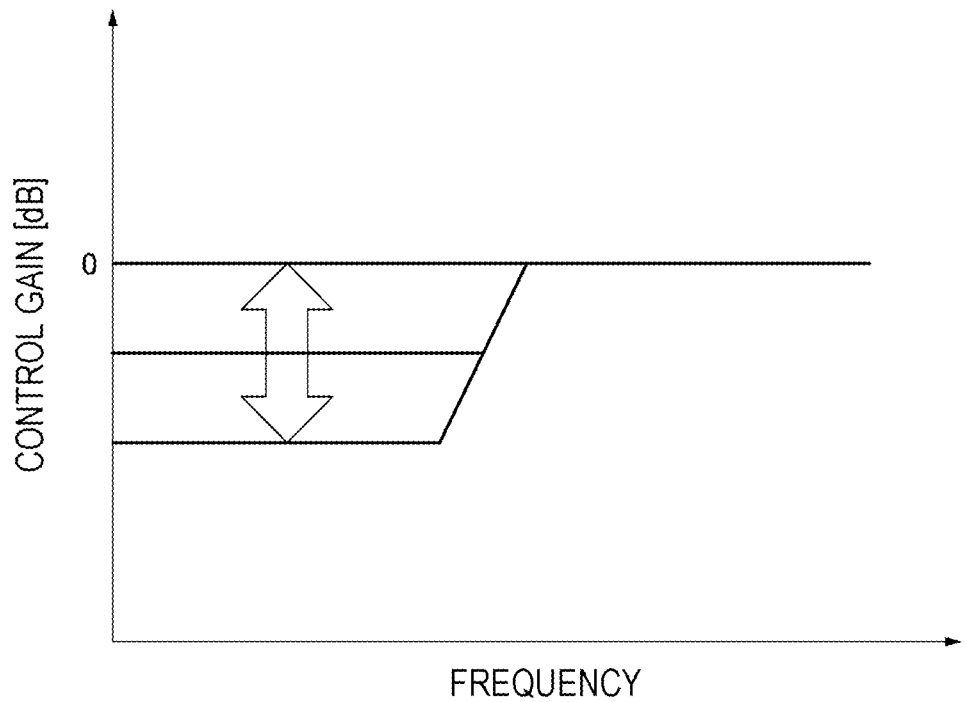
FIG. 7 is a diagram referred to in describing a specific example of the dynamic EQ according to the embodiment.
Figure 8:
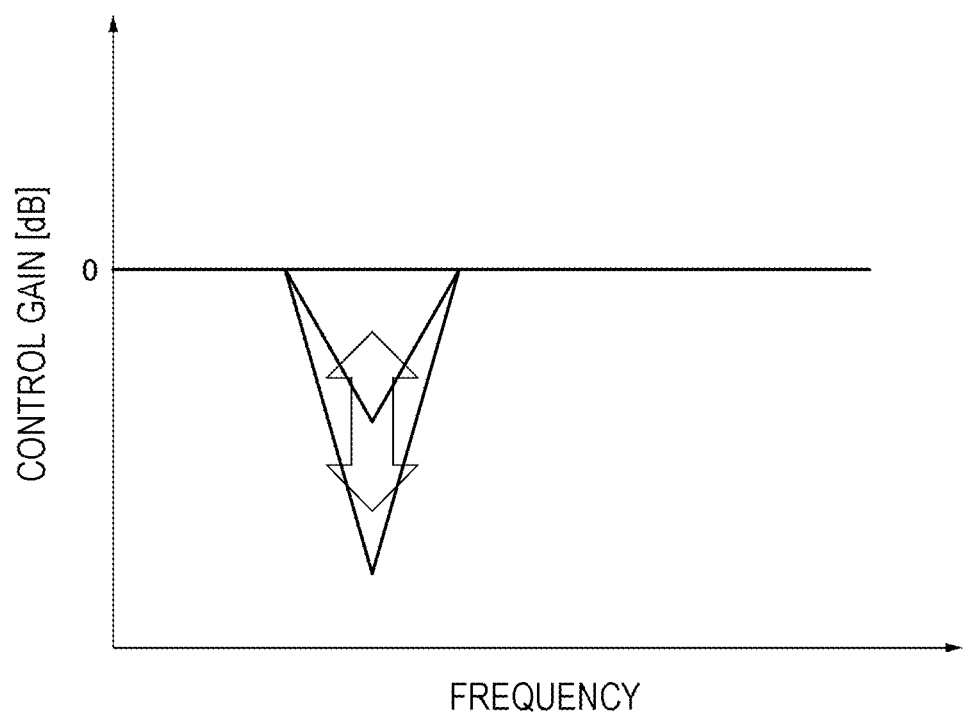
FIG. 8 is a diagram referred to in describing another specific example of the dynamic EQ according to the embodiment.

As schematically illustrated in FIG. 6, the dynamic EQ 205 adjusts the level of the low-frequency component of the input audio signal on the basis of the control gain. The audio signal processed by the dynamic EQ 205 is then output to the amplifier 30. As the dynamic EQ 205, a shelving filter or a parametric equalizer can be applied. FIG. 7 illustrates frequency characteristics in a case where a shelving filter is applied as the dynamic EQ 205. Furthermore, FIG. 8 illustrates frequency characteristics in a case where a parametric filter is applied as the dynamic EQ 205. Arrows in FIGS. 7 and 8 indicate that the control gain varies depending on the calculation result of the control gain calculation unit 203. Note that FIG. 6 illustrates an example in which a shelving filter is applied as the dynamic EQ 205.

Operation Example of Panel Displacement Control Unit

Figure 9:
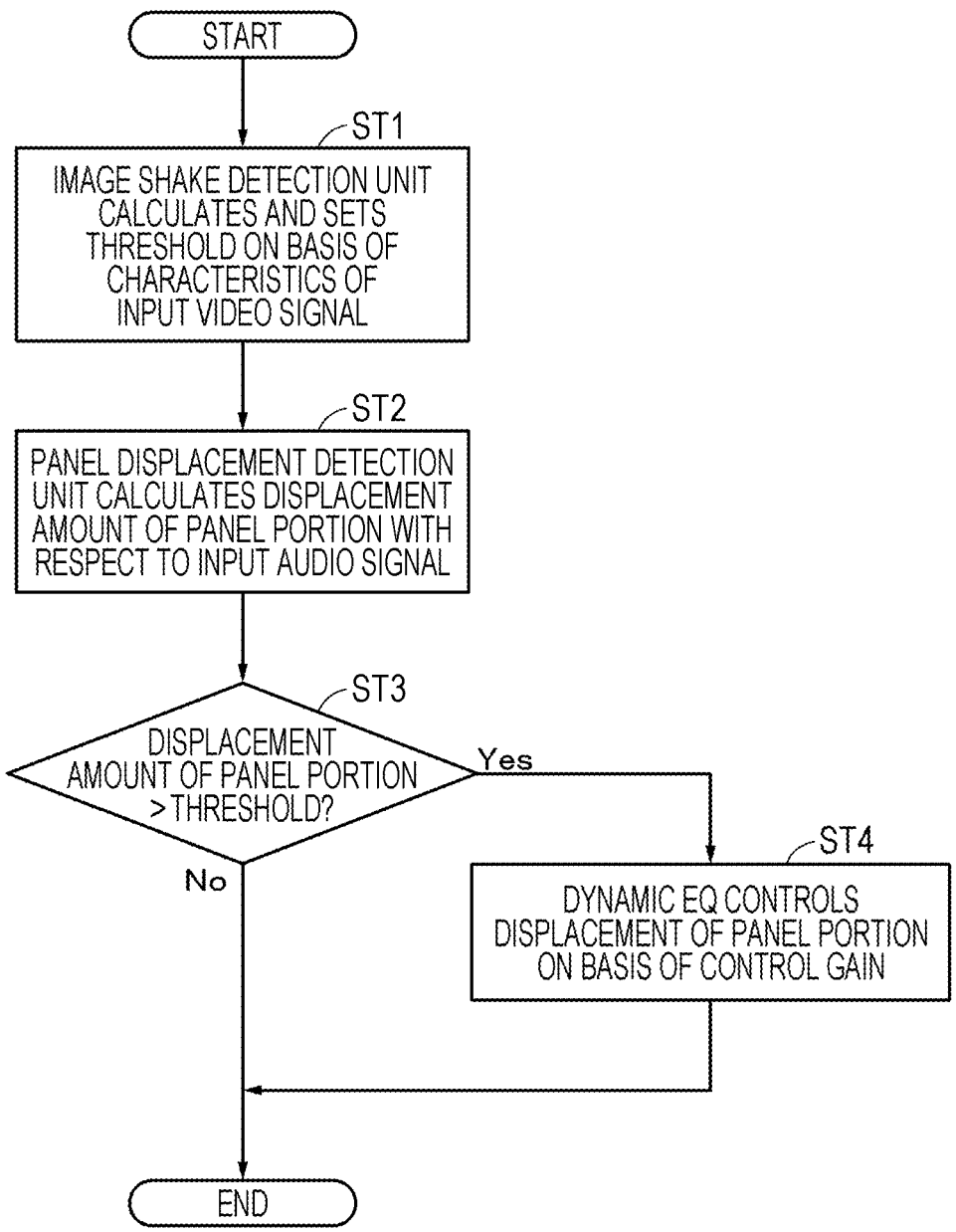
FIG. 9 is a flowchart illustrating a flow of processing performed by a panel displacement control unit according to the embodiment.

FIG. 9 is a flowchart illustrating a flow of processing performed by the panel displacement control unit 20 according to the present embodiment.

After the processing is started, in step ST1, the image shake detection unit 201 calculates and sets a threshold on the basis of characteristics of an input video signal. Then, the processing proceeds to step ST2.

In step ST2, the panel displacement detection unit 202 performs filter processing on the input audio signal to calculate the displacement amount of the panel portion 2 with respect to the input audio signal. Then, the processing proceeds to step ST3.

In step ST3, the control gain calculation unit 203 compares the threshold set in step ST1 with the displacement amount of the panel portion 2 calculated in step ST2. As a result of the comparison, in a case where the displacement amount of the panel portion 2 is larger than the threshold (Yes determination), the control gain calculation unit 203 calculates a control gain corresponding to the amount by which the displacement amount of the panel portion 2 exceeds the threshold such that the displacement amount of the panel portion 2 falls below the threshold. The control gain calculation unit 203 supplies the control gain calculated to the dynamic EQ 205. Then, the processing proceeds to step ST4.

In step ST4, the dynamic EQ 205 attenuates the level of the low-frequency component of the input audio signal using the control gain. As a result, the vibration of the panel portion 2 can be suppressed, and thus the occurrence of image shake can be suppressed. Then, the processing ends.

As a result of the comparison in the processing of step ST3, in a case where the displacement amount of the panel portion 2 is less than or equal to the threshold (No determination), the level of the low-frequency component of the input audio signal is output without being attenuated. For example, the control gain calculation unit 203 sets 0 dB as the control gain. The dynamic EQ 205 adjusts the level of the input audio signal with the set control gain (0 dB), in other words, outputs the input audio signal without changing the level thereof. Note that a loop connected from the delay unit 204 to the amplifier 30 without passing through the dynamic EQ 205 may be provided, and in a case where the displacement amount of the panel portion 2 is equal to or less than the threshold (No determination), the input audio signal may pass through the loop. The processing described above is repeated as appropriate.

Figure 10:
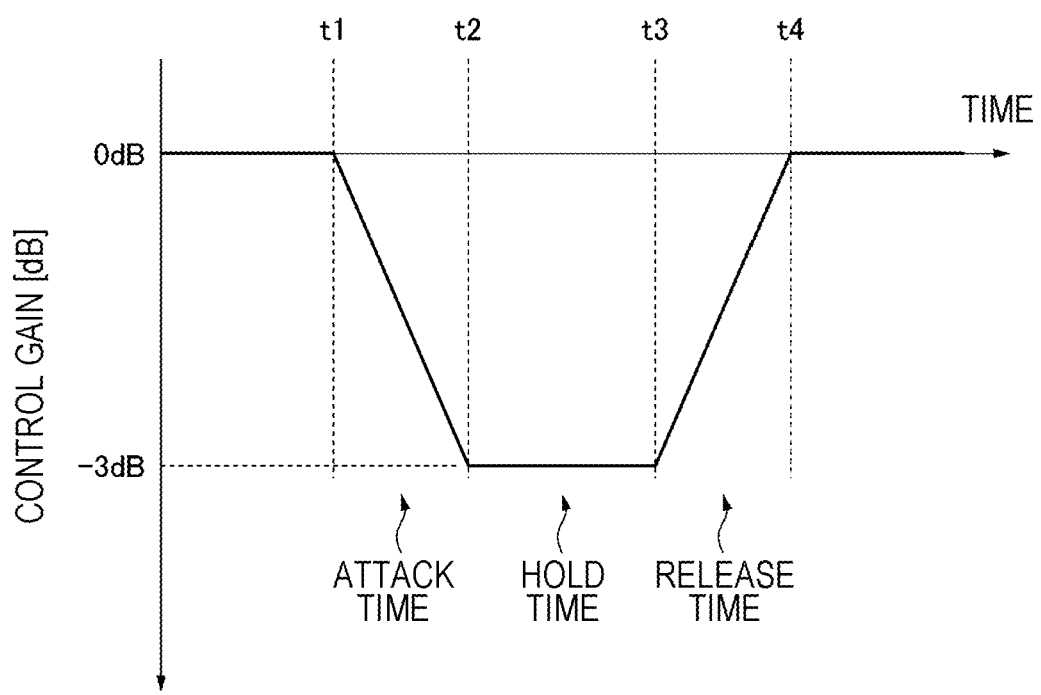
FIG. 10 is a diagram for describing attack time, hold time, and release time according to the embodiment.

Note that attack time, hold time, and release time can be set in the control gain. It is assumed that, for example, −3 dB is calculated as the control gain. As illustrated in FIG. 10, the attack time is a period (a period from t1 to t2 in FIG. 10) for gradually changing the control gain from 0 dB to −3 dB. In addition, the hold time is a period (a period from t2 to t3 in FIG. 10) in which the state where the control gain is −3 dB is maintained. The release time is a time (a period from t3 to t4 in FIG. 10) taken to return the control gain to 0 dB after the control gain does not need to be −3 dB.

As described above, in the present embodiment, the processing is performed by the dynamic EQ 205 while the control gain is changed on the basis of the attack time and the release time. Note that in a case where −3 dB is calculated again as the control gain while the control gain is changing during the release time, processing of gradually changing the control gain is performed at that timing so that the control gain is −3 dB.

When the level of the low-frequency component of the input audio signal rapidly attenuates, the viewer/listener may feel uncomfortable from an auditory point of view. By appropriately setting the attack time, the hold time, and the release time, it is possible to prevent the level of the low-frequency component of the input audio signal from being rapidly attenuated. In addition, human hearing is insensitive to a decrease in sound pressure, but is sensitive to an increase in sound pressure. In consideration of such auditory characteristics, in the present embodiment, the level of the low-frequency component of the input audio signal is quickly attenuated by setting the attack time to be short, thereby preventing the occurrence of image shake. Furthermore, by setting the release time longer than the attack time, the level of the low-frequency component of the input audio signal is gradually increased. As a result, it is possible to prevent the viewer/listener from feeling uncomfortable due to a change in the level of the low-frequency component of the input audio signal while suppressing the occurrence of image shake.

According to the present embodiment described above, the image shake detection unit 201 suppresses the displacement amount of the panel portion 2 on the basis of the characteristics of the input video signal. Consequently, in a case where the characteristics of the input video signal are likely to cause image shake, the vibration of the panel portion 2 is suppressed by reducing the threshold, so that the occurrence of the image shake can be effectively suppressed. On the other hand, in a case where the characteristics of the input video signal hardly cause the image shake, the level of the low-frequency component of the input audio signal is not attenuated, so that the sound pressure can be secured.

Modification

The embodiment of the present disclosure has been specifically described above, but the content of the present disclosure is not limited to the embodiment described above, and various modifications are possible on the basis of the technical idea of the present disclosure.

In the embodiment described above, the image shake detection unit 201 calculates the displacement amount on the basis of the characteristics related to the luminance of the input video signal, and sets the displacement amount as the threshold. However, the present disclosure is not limited thereto. The ease of occurrence of image shake differs not only by the luminance of the input video signal but also by the brightness of a viewing/listening space, a viewing/listening position, the reflectance of the panel portion 2, and the like. For example, the brighter the viewing/listening space, the more likely reflection and image shake are to occur. Consequently, in a case where the viewing/listening space is bright, the threshold is set to be small. Furthermore, the closer the viewing/listening position is to the front of the panel portion 2, the more easily the image shake is recognized. Consequently, the closer the viewing/listening position is to the front of the panel portion 2, the smaller the threshold is set. In addition, the higher the reflectance of the panel portion 2, the more likely reflection and image shake are to occur. Consequently, in a case where the reflectance of the panel portion 2 is high, the threshold calculated is corrected to be reduced to a certain extent even in a case where the luminance of the input video signal is large or in a case where the viewing/listening space is dark.

Figure 11:
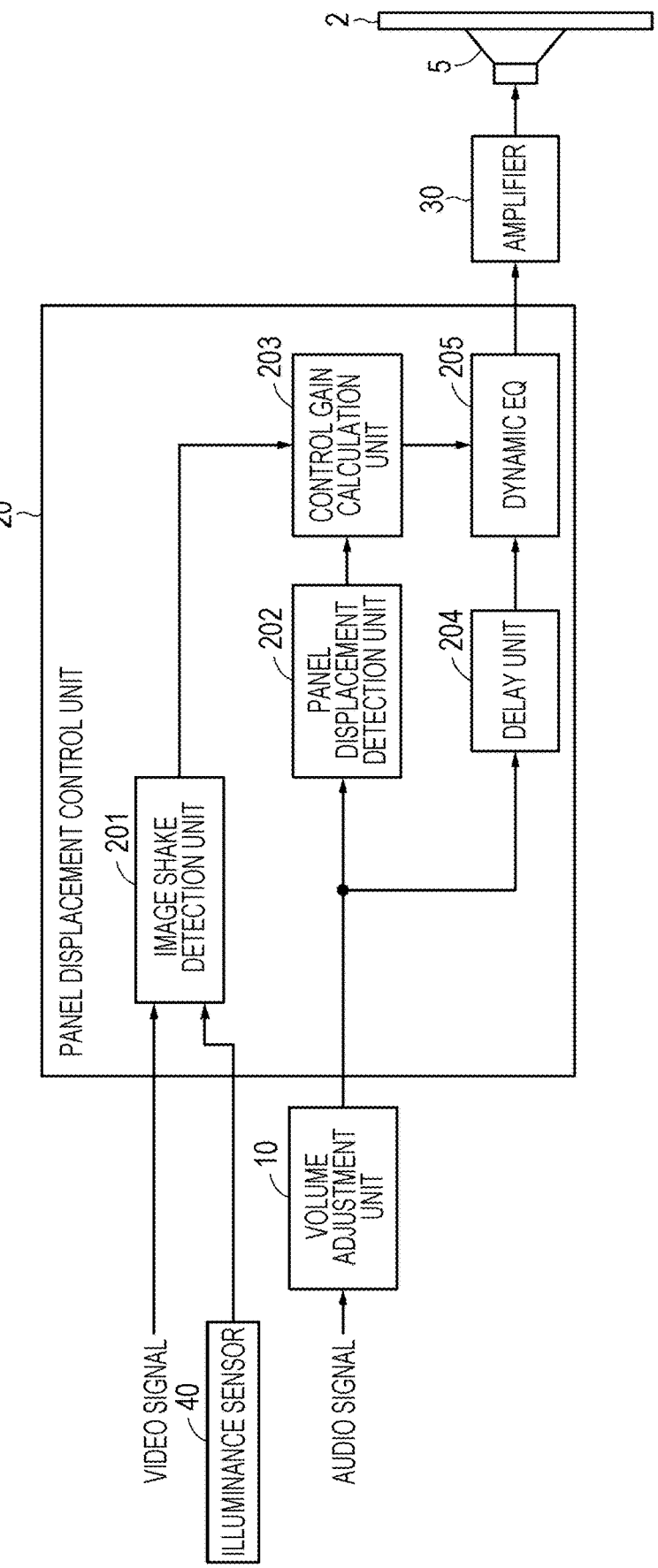
FIG. 11 is a diagram for describing a modification.

For example, as illustrated in FIG. 11, an illuminance sensor 40 that detects the brightness of the viewing/listening space may be provided, and sensing data indicating the brightness of the viewing/listening space may be supplied from the illuminance sensor 40 to the image shake detection unit 201. Then, the image shake detection unit 201 may calculate the threshold by referring to the sensing data supplied from the illuminance sensor 40. The illuminance sensor 40 may be a sensor that detects a viewing/listening position, specifically, a known sensor that detects a viewer/listener (a person). Further, the image shake detection unit 201 may correct a threshold calculated on the basis of specification information (a panel size, a reflectance, and the like) of the panel portion 2, the specification information being stored in advance. Furthermore, the image shake detection unit 201 may set the threshold by appropriately combining the methods described above.

The characteristics related to the luminance of the input video signal may include a value other than the luminance average value. One frame may be divided into, for example, four blocks, and the characteristics related to the luminance of the input video signal may be determined for each block. The processing unit of the image shake detection unit 201 can be appropriately set such as in units of a frame, in units of several frames, or the like. Similarly, the processing unit of the input audio signal can also be appropriately set such as in units of samples, in units of frames, or the like.

The volume adjustment unit 10 may be provided at a subsequent stage of the panel displacement control unit 20. In this case, it may be configured such that the volume information set in the volume adjustment unit 10 is supplied to the panel displacement detection unit 202. The panel displacement detection unit 202 may perform filter processing according to the volume information.

In the flow of processing described in the embodiment, the order of some processes may be changed, or some processes may be performed in parallel.

The present disclosure can also be implemented by a device, a method, a program, a system, and the like. For example, a program that performs the functions described in the above embodiment can be downloaded, and a device that does not have the functions described in the embodiment downloads and installs the program, so that the control described in the embodiment can be executed in the device. The present disclosure can also be implemented by a server that distributes such a program. In addition, the matters described in each of the embodiment and the modification can be appropriately combined. Furthermore, the contents of the present disclosure are not to be construed as being limited by the effects exemplified in the present specification.

The present disclosure can also adopt the following configurations.

(1)

A signal processing device including:
a displacement detection unit configured to detect a displacement amount of a video display panel that is vibrated to generate sound on the basis of an input audio signal;
a threshold setting unit configured to calculate a displacement amount at which no image shake occurs and set a displacement amount calculated as a threshold; and
a gain adjustment unit configured to adjust a level of the input audio signal on the basis of a result of comparison between a displacement amount detected by the displacement detection unit and the threshold.

(2)

The signal processing device according to (2), further including
a control gain calculation unit configured to calculate a control gain on the basis of a result of comparison between a displacement amount detected by the displacement detection unit and the threshold, in which
the gain adjustment unit adjusts a level of the input audio signal using the control gain.

(3)

The signal processing device according to (1) or (2), in which
the gain adjustment unit changes a gain from 0 dB to the control gain during predetermined attack time, and changes the gain from the control gain to 0 dB during predetermined release time.

(4)
   The signal processing device according to (3), in which the attack time is set to a value smaller than a value of the release time.

(5)
   The signal processing device according to any one of (1) to (4), in which
   the displacement detection unit includes a filter that approximates a displacement characteristic of the video display panel, the displacement characteristic being measured in advance.

(6)
   The signal processing device according to (2), in which
   the gain adjustment unit adjusts a level of the input audio signal using the control gain so as not to allow the displacement amount to exceed the threshold.

(7)
   The signal processing device according to any one of (1) to (4), in which
   the threshold setting unit calculates the displacement amount on the basis of a characteristic of an input video signal.

(8)
   The signal processing device according to (7), in which
   the threshold setting unit calculates the displacement amount on the basis of a characteristic related to luminance of the input video signal.

(9)
   The signal processing device according to (7) or (8), in which
   the threshold setting unit calculates the displacement amount on the basis of sensing data supplied from a sensor.

(10)
   The signal processing device according to (9), in which
   the sensor includes at least one of an illuminance sensor or a sensor that detects a viewer/listener.

(11)
   The signal processing device according to (9) or (10), in which
   the threshold setting unit calculates the displacement amount on the basis of specification information of the video display panel.

(12)
   A signal processing method including:
   causing a displacement detection unit to detect a displacement amount of a video display panel that is vibrated to generate sound on the basis of an input audio signal;
   causing a threshold setting unit to calculate a displacement amount at which no image shake occurs and set a displacement amount calculated as a threshold; and
   causing a gain adjustment unit to adjust a level of the input audio signal on the basis of a result of comparison between a displacement amount detected by the displacement detection unit and the threshold.

(13)
   A program that causes a computer to perform a signal processing method, the signal processing method including
   causing a displacement detection unit to detect a displacement amount of a video display panel that is vibrated to generate sound on the basis of an input audio signal,
   causing a threshold setting unit to calculate a displacement amount at which no image shake occurs and set a displacement amount calculated as a threshold, and
   causing a gain adjustment unit to adjust a level of the input audio signal on the basis of a result of comparison between a displacement amount detected by the displacement detection unit and the threshold.

(14)
   A video display device including:
   a vibration portion;
   a video display panel configured to display a video and generate sound by being vibrated by the vibration portion;
   a panel displacement control unit configured to control displacement of the video display panel; and
   an amplifier configured to amplify an audio signal output from the panel displacement control unit and output an audio signal amplified to the vibration portion, in which
   the panel displacement control unit includes
   a displacement detection unit configured to detect a displacement amount of the video display panel on the basis of an input audio signal,
   a threshold setting unit configured to calculate a displacement amount at which no image shake occurs and set a displacement amount calculated as a threshold, and
   a gain adjustment unit configured to adjust a level of the input audio signal on the basis of a result of comparison between a displacement amount detected by the displacement detection unit and the threshold.

REFERENCE SIGNS LIST

1 Video display device
2 Panel portion
5 Vibration portion
5A, 5B Vibrator
20 Panel displacement control unit
30 Amplifier
201 Image shake detection unit
202 Panel displacement detection unit
203 Control gain calculation unit
205 Dynamic EQ

The invention claimed is:

1. A signal processing device comprising:
a displacement detection unit configured to detect a displacement amount of a video display panel that is vibrated to generate sound on a basis of an input audio signal;
a threshold setting unit configured to calculate a displacement amount at which no image shake occurs and set a displacement amount calculated as a threshold;
a gain adjustment unit configured to adjust a level of the input audio signal on a basis of a result of comparison between a displacement amount detected by the displacement detection unit and the threshold; and
a control gain calculation unit configured to calculate a control gain on a basis of a result of comparison between a displacement amount detected by the displacement detection unit and the threshold, wherein
the gain adjustment unit adjusts a level of the input audio signal using the control gain.

2. The signal processing device according to claim 1, wherein
the gain adjustment unit changes a gain from 0 dB to the control gain during predetermined attack time, and changes the gain from the control gain to 0 dB during predetermined release time.

3. The signal processing device according to claim 2, wherein
the attack time is set to a value smaller than a value of the release time.

4. The signal processing device according to claim 1, wherein
the displacement detection unit includes a filter that approximates a displacement characteristic of the video display panel, the displacement characteristic being measured in advance.

5. The signal processing device according to claim 1, wherein
the gain adjustment unit adjusts a level of the input audio signal using the control gain so as not to allow the displacement amount to exceed the threshold.

6. The signal processing device according to claim 1, wherein
the threshold setting unit calculates the displacement amount on a basis of a characteristic of an input video signal.

7. The signal processing device according to claim 6, wherein
the threshold setting unit calculates the displacement amount on a basis of a characteristic related to luminance of the input video signal.

8. The signal processing device according to claim 6, wherein
the threshold setting unit calculates the displacement amount on a basis of sensing data supplied from a sensor.

9. The signal processing device according to claim 8, wherein
the sensor includes at least one of an illuminance sensor or a sensor that detects a viewer/listener.

10. The signal processing device according to claim 8, wherein
the threshold setting unit calculates the displacement amount on a basis of specification information of the video display panel.

11. A signal processing method comprising:
causing a displacement detection unit to detect a displacement amount of a video display panel that is vibrated to generate sound on a basis of an input audio signal;
causing a threshold setting unit to calculate a displacement amount at which no image shake occurs and set a displacement amount calculated as a threshold;
causing a gain adjustment unit to adjust a level of the input audio signal on a basis of a result of comparison between a displacement amount detected by the displacement detection unit and the threshold; and
causing a control gain calculation unit to calculate a control gain on a basis of a result of comparison between a displacement amount detected by the displacement detection unit and the threshold, wherein
the level of the input audio signal is adjusted using the control gain.

12. A non-transitory computer readable medium storing a program which, when executed, causes a computer to perform a signal processing method, the signal processing method including:
causing a displacement detection unit to detect a displacement amount of a video display panel that is vibrated to generate sound on a basis of an input audio signal,
causing a threshold setting unit to calculate a displacement amount at which no image shake occurs and set a displacement amount calculated as a threshold,
causing a gain adjustment unit to adjust a level of the input audio signal on a basis of a result of comparison between a displacement amount detected by the displacement detection unit and the threshold; and
causing a control gain calculation unit to calculate a control gain on a basis of a result of comparison between a displacement amount detected by the displacement detection unit and the threshold, wherein
the level of the input audio signal is adjusted using the control gain.

13. A video display device comprising:
a vibration portion;
a video display panel configured to display a video and generate sound by being vibrated by the vibration portion;
a panel displacement control unit configured to control displacement of the video display panel; and
an amplifier configured to amplify an audio signal output from the panel displacement control unit and output an audio signal amplified to the vibration portion, wherein
the panel displacement control unit includes
a displacement detection unit configured to detect a displacement amount of the video display panel on a basis of an input audio signal,
a threshold setting unit configured to calculate a displacement amount at which no image shake occurs and set a displacement amount calculated as a threshold, and
a gain adjustment unit configured to adjust a level of the input audio signal on a basis of a result of comparison between a displacement amount detected by the displacement detection unit and the threshold; and
a control gain calculation unit configured to calculate a control gain on a basis of a result of comparison between a displacement amount detected by the displacement detection unit and the threshold, wherein
the gain adjustment unit adjusts a level of the input audio signal using the control gain.

* * * * *